US006387602B1

United States Patent
Hayden et al.

(10) Patent No.: US 6,387,602 B1
(45) Date of Patent: May 14, 2002

(54) APPARATUS AND METHOD OF CLEANING RETICLES FOR USE IN A LITHOGRAPHY TOOL

(75) Inventors: Cindy J. Hayden, Wallingford; David H. Peterson, Shelton, both of CT (US)

(73) Assignee: Silicon Valley Group, Inc., San Jose, CA (US)

( * ) Notice: Subject to any disclaimer, the term of this patent is extended or adjusted under 35 U.S.C. 154(b) by 0 days.

(21) Appl. No.: 09/504,539

(22) Filed: Feb. 15, 2000

(51) Int. Cl.⁷ .................................................. G03C 5/00

(52) U.S. Cl. ........................... 430/327; 430/5; 134/1; 134/18; 134/39; 134/122 P; 134/133; 134/64 P; 216/12; 355/99

(58) Field of Search ...................... 430/327, 5; 216/12, 216/66; 134/1, 39, 18, 122 P, 133, 64 P; 355/99

(56) References Cited

U.S. PATENT DOCUMENTS

| | | | |
|---|---|---|---|
| 5,503,708 A | 4/1996 | Koizumi et al. | 134/13 |
| 5,510,158 A | 4/1996 | Hiramoto et al. | 216/66 |
| 5,669,979 A | 9/1997 | Elliott et al. | 134/1 |
| 5,814,156 A | 9/1998 | Elliott et al. | 134/1 |
| 5,958,268 A | 9/1999 | Engelsberg et al. | 134/1 |
| 6,048,588 A | 4/2000 | Engelsberg et al. | 216/66 |

FOREIGN PATENT DOCUMENTS

| | | |
|---|---|---|
| DE | 0 510 503 A2 | 10/1992 |
| JP | 01 265513 A | 10/1989 |
| JP | 4-83340 | 3/1992 |
| JP | 08 236492 A | 9/1996 |
| JP | 11-40478 | 2/1999 |
| JP | 11-95413 | 4/1999 |

OTHER PUBLICATIONS

English Abstract of JP Patent No. JP–04083340 (listed above), "Cleaning Treatment of Substrate", Publication Source: Patent Abstracts of Japan, Unexamined Applications, Section E, Sect. No. 1228, vol. 16, No. 3, p. 111 (19920703); Answer 5 © JPO, 1 page.

Jerzy Ruzyllo, "Overview of Dry Wafer Cleaning Processes", *Handbook of Semiconductor Wafer Cleaning Technology*, pp. 201–231 (published before Aug. 29, 1993).

John R. Vig. "UV/Ozone Cleaning of Surfaces", *Treatise on Clean Surface Technology*, Plenum Press, pp. 1–26 (1987).

English Abstract of JP Application No. JP 01 265513, "Reduction Projection Aligner", Publication Source: Patent Abstracts of Japan, vol. 014, No. 028 (E–875), Jan. 19, 1990.

English Abstract of JP Application No. JP 08 236492, "Optical Cleaning Method", Publication Source: Patent Abstracts of Japan, vol. 1997, No. 01, Jan. 31, 1997.

(List continued on next page.)

*Primary Examiner*—Richard L. Schilling
(74) *Attorney, Agent, or Firm*—Sterne, Kessler, Goldstein & Fox P.L.L.C.

(57) ABSTRACT

A reticle cleaning apparatus that utilizes an ultraviolet light source in an oxygen-containing environment to cleanse organic contaminants from a reticle. The reticle cleaning apparatus of the present invention enables the storage of multiple reticles for use in a lithography tool in an environment which contains organic contaminants. A stored reticle is translated to a reticle cleaning station within the lithography tool in order to cleanse the reticle of organic contaminants. This cleaning can be performed while the projection optics of the tool exposes a wafer using another reticle previously cleaned by the reticle cleaning apparatus. Upon completion of the reticle cleaning process, the reticle is immediately translated to the exposure path of the lithography tool. The reticle cleaning process is performed during normal operation of the lithography tool at room temperature, atmospheric pressure and in an oxygen-containing environment.

5 Claims, 2 Drawing Sheets

OTHER PUBLICATIONS

J.J. Festa et al., "Cleaning of SCALPEL Next Generation Lithography Masks using PLASMAX, a Revolutionary Dry Cleaning Technology", Publication Source: 19$^{th}$ Annual BACUS Symposium on Photomask Technology, Monterey, CA, USA, 15–17 Sep. 15–17, 1999, SPIE vol. 3873, pp. 916–926.

D. Yogev et al., "Laser Chemical Process for Clean Applications of Semiconductor Manufacturing", Publication Source: Laser Applications in Microelectronic and Optoelectronic Manufacturing V, Proceedings of SPIE, vol. 3933 (2000), pp. 77–88.

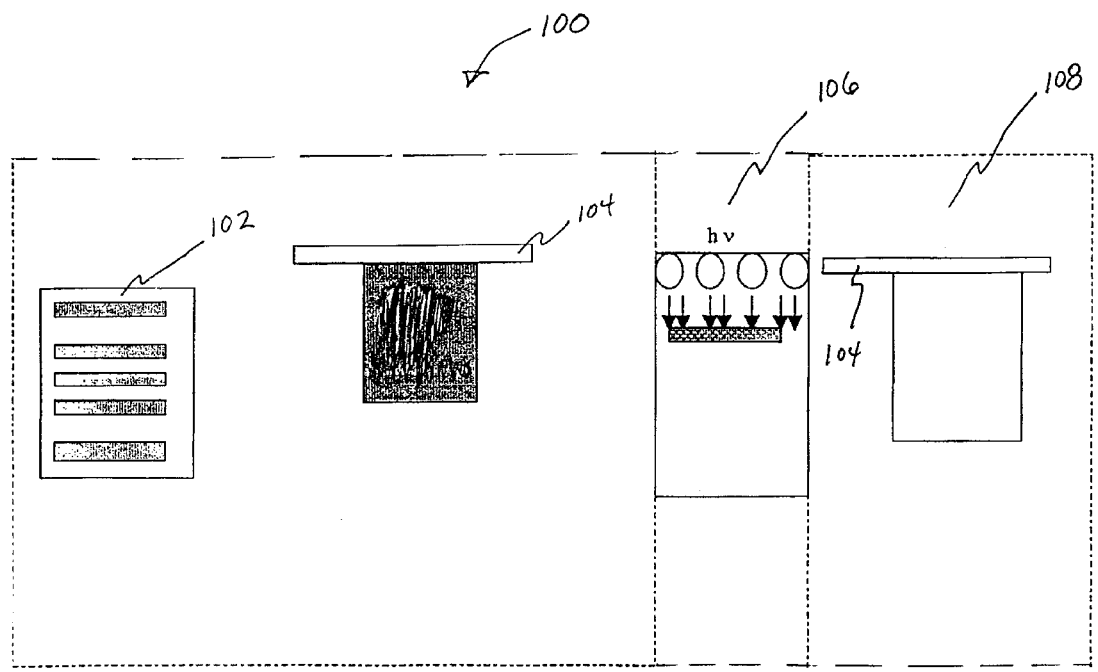
FIG. 1
FIG. 2
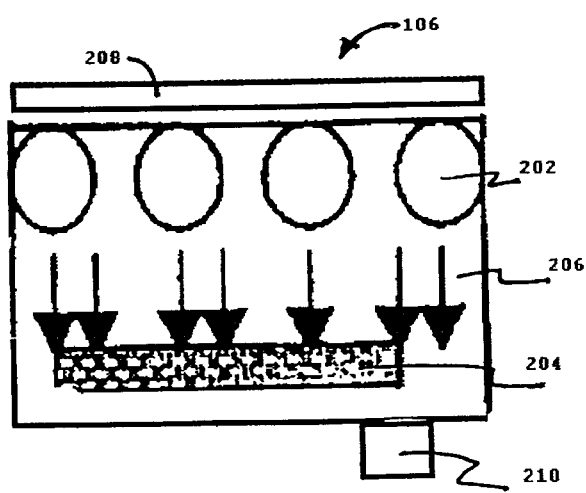

APPARATUS AND METHOD OF CLEANING RETICLES FOR USE IN A LITHOGRAPHY TOOL

BACKGROUND OF THE INVENTION

1. Field of the Invention

The present invention relates generally to photolithographic illumination systems. More particularly, this invention relates to cleaning a reticle prior to its use in a photolithography tool.

2. Related Art

Photolithography (also called microlithography or optical lithography) is a semiconductor device fabrication technology. Photolithography (hereinafter referred to as lithography) uses ultraviolet or visible light to generate fine patterns in a semiconductor device design. Many types of semiconductor devices, such as diodes and transistors, can be fabricated as integrated circuits using lithographic techniques. Exposure systems or tools are used to implement lithographic techniques, such as etching, in semiconductor fabrication. An exposure system typically includes an illumination system, a reticle (also called a mask) containing a circuit pattern, a projection system, and a wafer alignment stage for aligning a photosensitive resist covered semiconductor wafer. The illumination system illuminates the reticle with a preferably rectangular slot illumination field to produce an image of the reticle circuit pattern. The projection system projects the image of the reticle circuit pattern onto the wafer.

The illumination system of a lithographic tool includes a light source. Excimer lasers are one such light source and operate at several characteristic wavelengths ranging from vacuum ultraviolet light to greater than 400 nanometers (nm) depending on the gas mixture used, as represented below.

Wavelengths for excimer lasers

| Excimer | Wavelength |
|---------|------------|
| XeF     | 351 nm     |
| XeCl    | 308 nm     |
| KrF     | 248 nm     |
| KrCl    | 222 nm     |
| ArF     | 193 nm     |
| $F_2$   | 157 nm     |

By shortening the wavelength of the light, the resolution of the optical projection system is improved. Thus, in a lithography tool it is desirable to utilize a light source with wavelengths within the vacuum ultraviolet range, i.e., below 200 nm.

As shorter wavelength light sources are used in lithography, organic contamination in the exposure area of the lithography tool becomes a greater problem. It is well known that organic contaminates have high optical absorption coefficients at shorter wavelengths, particularly at 157 nm. A 1 nm film of organic contaminant belonging to the alkane group will drop the optical transmission at 157 nm by 1%. Further, an acetone residue left on the surface of a calcium fluoride optical element reduces the transmission by 4% at 157 nm. (See, T. M. Bloomstein et al., *Optical Materials and Coatings at* 157 nm, 3676 S.P.I.E. Proceedings 342–9 (1999) incorporated herein by reference). Optical intensity is an important issue as the number of optical elements increases in a lithography tool. It is for this reason that organic contamination can be detrimental to optical elements in 157 nm lithography.

Sources of organic contamination within a lithography tool include out-gassed products from polymer materials and solvents used for degreasing tool parts. Extremely low levels of organic contamination are critical for the exposure path in the lithography tool, and an active purge system and strict material selection are required for those areas of the tool associated with this path. The areas of the lithography tool that are controlled in this manner to keep contamination to a minimum are referred to as clean.

There are areas of a lithography tool for which cleanliness is not critical for operation such as the reticle storage area. Organic contamination is assumed to be present in such areas. However, with use of shorter wavelength lithography tools that have a greater sensitivity to organic contaminants, it is necessary to maintain even the reticle storage area in a clean state. This practice is necessary to avoid introduction of organic contaminates to the exposure system. Thus, an additional area of the lithography tool is added to the areas within which it is critical to maintain a clean environment. This increases the cost of the lithography tool and maintenance thereof Therefore, it is desirable to develop a system to avoid adding the reticle storage area to the critical list of areas of a lithography tool that must be maintained as a "clean" environment.

SUMMARY OF THE INVENTION

The present invention is directed to integrating a cleaning station with a lithography tool to eliminate the need to maintain the reticle storage area (also known as the reticle library) as a clean environment. According to the present invention, the reticle would be cleaned directly prior to use. Therefore, special "clean" storage is not necessary for the reticle library. The reticle cleaning procedure permits a library of reticles inside the lithography tool to be maintained without adding unnecessary environmental constraints. The reticles are retrieved from the reticle library and translated to the cleaning station in which the cleaning process occurs. Upon completion of the cleaning process, the reticle meets the cleanliness requirements for use in the exposure area of the lithography tool.

The reticle cleaning process of the present invention can be conducted at room temperature, atmospheric pressure and in an oxygen-containing environment. Moreover, the reticle cleaning process is performed in situ, thereby permitting the lithography tool to perform exposure using one reticle while the next reticle to be used is being cleaned.

Further features and advantages of the present invention, as well as the structure and operation of various embodiments of the present invention, are described in detail below with reference to the accompanying drawings.

BRIEF DESCRIPTION OF THE FIGURES

The accompanying drawings, which are incorporated herein and form part of the specification, illustrate the present invention and together with the description further serve to explain the principles of the invention and to enable a person skilled in the pertinent art to make and use the invention.

FIG. 1 is a block diagram of a lithography tool incorporating a reticle cleaning station.

FIG. 2 is a schematic diagram of a reticle cleaning station.

DETAILED DESCRIPTION OF THE PREFERRED EMBODIMENTS

Figure 3:
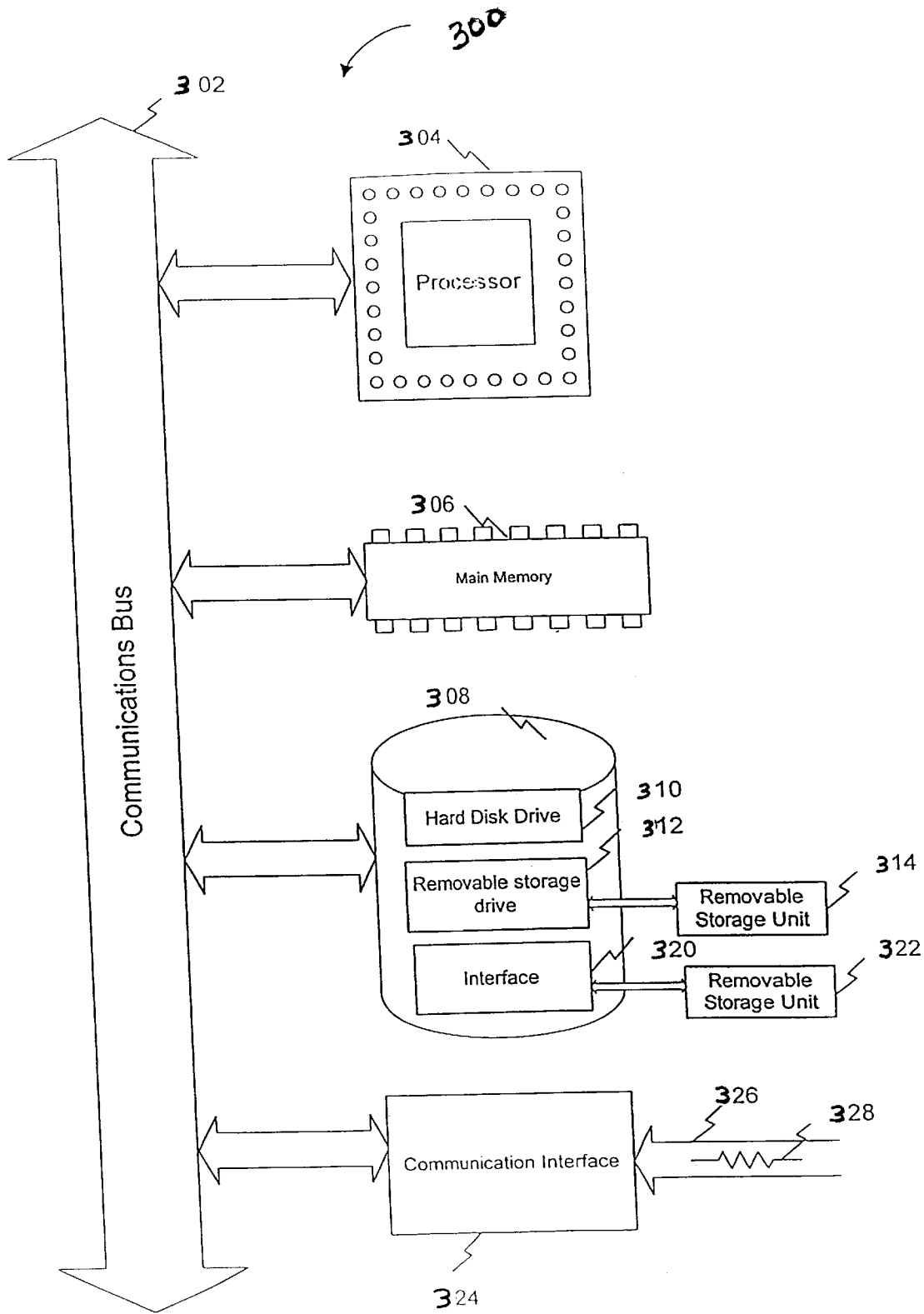
FIG. 3 illustrates a computer system block diagram for computer controlled monitoring of contaminants to determine optimum cleaning time of reticles in accordance with the present invention.

A preferred embodiment of the present invention is now described with reference to the figures where like reference numbers indicate identical or functionally similar elements. Also in the figures, the left most digit of each reference number corresponds to the figure in which the reference number is first used. While specific configurations and arrangements are discussed, it should be understood that this is done for illustrative purposes only. A person skilled in the relevant art will recognize that other configurations and arrangements can be used without departing from the spirit and scope of the invention. It will be apparent to a person skilled in the relevant art that this invention can also be employed in a variety of other applications.

FIG. 1 is a block diagram of a lithography tool incorporating a reticle cleaning station. Lithography tool 100 can be any commercially available lithography exposure tool, such as those tools manufactured by SVG Lithography Systems, Inc. of Wilton, Conn. Particularly a lithography tool operating at any of the following wavelengths:

Wavelengths for Optical Lithography

| Optical Region | Wavelength |
|---|---|
| I-Line | 365 nm |
| DUV | 248 nm |
| VDUV | 193 nm |
| VUV | 157 nm |
| EUV | 13 nm (approximately) |

Among other features, lithography tool 100 has reticle storage area 102, reticle cleaning station 106 and exposure area 108. Multiple reticles are stored in reticle storage area 102, also known as a reticle library, which according to the present invention need not be maintained as a clean environment. Robot 104 retrieves a reticle from reticle storage area 102 and transports the reticle to reticle cleaning station 106. Robot 104 can be any commercially available robotic system that can be adapted for use in a lithography tool, such as the RX60 model manufactured by The Staubli Group of Faverges, France. Within reticle cleaning station 106, the reticle is cleansed of organic contamination as discussed in detail below. Robot 104 then transports the clean reticle directly to the clean environment of exposure area 108 for immediate use. Exposure area 108 may include a light source, a filter, illumination optics, projection optics, an alignment system and a wafer stage as is generally known in the art. Particularly a lithography exposure system as utilized in any one of the Micrascan family of lithography tools manufactured by SVG Lithography Systems, Inc. of Wilton, Conn. that are incorporated herein by reference.

As represented by the schematic diagram of FIG. 2, reticle cleaning station 106 is comprised of ultraviolet light source 202, reticle holding member 204, oxygen-containing environment 206 and reflectors 208. Ultraviolet light source 202 includes an assembly of ultraviolet (UV) lamps that have wavelengths between 300 nm and 2 nm. In one embodiment of reticle cleaning station 106, ultraviolet light source 202 consists of an assembly of UV lamps such as a Hg lamp assembly, which emits light with wavelengths of 184.9 nm and 253.7 nm. In another embodiment of reticle cleaning station 106, ultraviolet light source 202 consists of an assembly of VUV lamps such as an Xe eximer lamp assembly, which emits light with a wavelength of 172nm. The number of lamps in each assembly is dependent on the area to be illuminated, and is thus application specific as would be apparent to one skilled in the lithography art.

Reticle holding member 204 is located in the reticle cleaning station so as to hold the reticle to be cleaned parallel with and in close proximity to ultraviolet light source 202. Behind ultraviolet light source 202 are reflectors 208, which enable uniform forward illumination of the reticle to be cleaned. Reflectors 208 are optional and can be fabricated from a corrosion resistant material such as Alzak, an aluminum material with a corrosion-resistant oxide coating licensed by the Aluminum Company of America of Pittsburgh, Pa.

Reticle cleaning station 106 requires an oxygen-containing environment 206 for the cleaning operation. The reticle cleaning operation consists essentially of UV radiation from light source 202 acting upon diatomic oxygen contained in the oxygen-containing environment 206 and organic contamination from the reticle, thereby creating atomic oxygen and dissociated organic contaminants. At the appropriate UV wavelengths, diatomic oxygen will dissociate into atomic oxygen. The creation of atomic oxygen is a cyclic process that also involves the generation of ozone due to the atomic oxygen combining with diatomic oxygen to form ozone. Ozone will photo-dissociate into atomic oxygen and diatomic oxygen, as represented below.

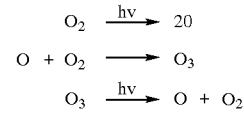

Atomic oxygen is highly reactive and therefore will also oxidize organic contaminants found on a reticle thereby forming gas phase products, such as carbon dioxide and water. Environment 206 is purged of the gas phase contaminants during the cleaning cycle by purge subsystem 210. According to an embodiment of the present invention, purge subsystem 210 introduces a pressurized inert gas into reticle cleaning station 106, which displaces gas phase $H_2O$ and $CO_2$. For example, purge subsystem 210 can comprise a vacuum pump to remove the gas phase contaminants. Appropriate purge systems for semiconductor processing would become apparent to a person skilled in the relevant art given the present description and application.

Thus, as described above and in accordance with the present invention, a reticle cleaning station can be integrated into the lithography tool. A reticle is pulled out of its storage container within the reticle storage area by a robot and translated to the reticle cleaning station. The reticle is positioned to the UV lamp assembly within close proximity of the UV lamps within the reticle cleaning station. The UV lamps are activated for the cleaning process. The duration of this process depends on the chemical makeup of the reticle and extent of contamination of the reticle. The cleaning time can be set a priori or determined automatically by computer controlled monitoring of the level of contaminant being purged. Such computer controlled monitoring can be performed by the computer system described below. Upon completion of the cleaning cycle, the reticle is immediately translated by robot to its final destination, the exposure path within the exposure station of the lithography tool.

The reticle cleaning method described can be utilized with lithography tools of various wavelengths. However, the present invention is particularly useful for cleaning reticles prior to usage in a 157 nm optical lithography system. The reticle cleaning process can be performed at room temperature, atmospheric pressure, and in an oxygen-containing environment and is performed during normal operation of the lithography tool.

Referring to FIG. 3 and as noted above, computer controlled monitoring of contaminants to determine optimum cleaning time can be performed by an example computer system 300. A computer system 300 includes one or more processors, such as processor 304. Processor 304 is connected to a communications bus 302. After reading this description, it will become apparent to a person skilled in the relevant art how to implement the invention using other computer systems and/or computer architectures.

Computer system 300 also includes a main memory 306, preferably random access memory (RAM), and can also include a secondary memory 308. Secondary memory 308 can include, for example, a hard disk drive 310 and/or a removable storage drive 312, representing a floppy disk drive, a magnetic tape drive, an optical disk drive, etc. Removable storage drive 312 reads from and/or writes to a removable storage unit 314 in a well-known manner. Removable storage unit 314, represents a floppy disk, magnetic tape, optical disk, etc. which is read by and written to by removable storage drive 312. Removable storage unit 314 includes a computer usable storage medium having stored therein computer software and/or data.

In alternative embodiments, secondary memory 308 can include other similar means for allowing computer programs or other instructions to be loaded into computer system 300. Such means can include, for example, a removable storage unit 322 and an interface 320. Examples of such can include a program cartridge and cartridge interface (such as that found in video game devices), a removable memory chip (such as an EPROM, or PROM) and associated socket, and other removable storage units 322 and interfaces 320 which allow software and data to be transferred from the removable storage unit 322 to computer system 300.

Computer system 300 can also include a communication interface 324. Communication interface 324 allows software and data to be transferred between computer system 300 and external devices. Examples of communication interface 324 include, but are not limited to a modem, a network interface (such as an Ethernet card), a communications port, a PCMCIA slot and card, etc. Software and data transferred via communication interface 324 are in the form of signals which can be electronic, electromagnetic, optical or other signals capable of being received by communication interface 324. These signals 326 are provided to communications interface via a channel 328. This channel 328 carries signals 326 and can be implemented using wire or cable, fiber optics, a phone line, a cellular phone link, an RF link and other communications channels. Moreover, computer system 300 can be directly controlled or programmed by a main lithography tool computer (not shown) via communication interface 324.

Data concerning the contaminant level detected by known chemical detection apparatus can be processed by the computer system 300 via communication interface 324. The computer system 300 can be programmed to determine the appropriate reticle cleaning time based on this data so as to control robot 104 and reticle cleaning station 106.

In this document, the terms "computer program medium" and "computer usable medium" are used to generally refer to media such as removable storage device 312, a hard disk installed in hard disk drive 310, and signals 326. These computer program products are means for providing software to computer system 300.

Computer programs (also called computer control logic) are stored in main memory and/or secondary memory 308. Computer programs can also be received via communication interface 324. Such computer programs, when executed, enable the computer system 300 to perform the features of the present invention as discussed herein. In particular, the computer programs, when executed, enable the processor 304 to perform the features of the present invention, such as controlling reticle cleaning time. Accordingly, such computer programs represent controllers of the computer system 300.

In an embodiment where the invention is implemented using software, the software can be stored in a computer program product and loaded into computer system 300 using removable storage drive 3 12, hard drive 310 or communication interface 324. The control logic (software), when executed by the processor 304, causes the processor 304 to perform the functions of the invention as described herein.

In another embodiment, the present invention is implemented primarily in hardware using, for example, hardware components such as application specific integrated circuits (ASICs). Implementation of the hardware state machine so as to perform the functions described herein will be apparent to persons skilled in the relevant art(s).

In yet another embodiment, the invention is implemented using a combination of both hardware and software.

While various embodiments of the present invention have been described above, it should be understood that they have been presented by way of example, and not limitation. It will be apparent to persons skilled in the relevant art that various changes in form and detail can be made therein without departing from the spirit and scope of the invention. Thus the present invention should not be limited by any of the above-described exemplary embodiments, but should be defined only in accordance with the following claims and their equivalents. All cited patent documents and publications in the above description are incorporated herein by reference.

What is claimed is:

1. A method of cleaning a reticle in a lithography tool comprising:
    an illumination system constructed and arranged to supply a beam of light;
    a reticle exposure station constructed and arranged to hold a reticle comprising a circuit pattern serving to pattern the beam of light according to the circuit pattern;
    a wafer stage for holding a wafer;
    a projection system constructed and arranged to project the patterned beam of light onto the wafer;
    a reticle storage area constructed and arranged to store a plurality of reticles;
    a reticle cleaning station comprising an oxygen-containing environment, an ultraviolet light source constructed and arranged to generate ultraviolet rays and a reticle holding member; and
    a robot constructed and arranged to transfer the reticle from each one of the reticle exposure station, the reticle storage area and the reticle cleaning station, wherein the method comprises the steps of:
        retrieving a first reticle from one of said reticle exposure station and said reticle storage area using the robot;

transporting the first reticle to the reticle cleaning station;

irradiating the first reticle with the ultraviolet rays in an oxygen-containing atmosphere, while contemporaneously permitting the lithographic tool to perform exposure of a second reticle; and transferring the first reticle to one of said reticle exposure station and said reticle storage area using the robot.

2. A method according to claim 1, wherein the ultraviolet light source generates radiation having a wavelength of 172 nm.

3. A method according to claim 1, wherein the reticle cleaning station is kept at ambient temperature and atmospheric pressure.

4. A method according to claim 1, further comprising:

purging the reticle cleaning station.

5. A lithographic tool comprising:

an illumination system constructed and arranged to supply a beam of light;

a reticle exposure station constructed and arranged to hold a reticle comprising a circuit pattern serving to pattern the beam of light according to the circuit pattern;

a wafer stage constructed and arranged to hold a wafer;

a projection system constructed and arranged to project the patterned beam of light onto the wafer;

a reticle storage area constructed and arranged to store a plurality of reticles;

a reticle cleaning station comprising an oxygen-containing environment, an ultraviolet light source constructed and arranged to generate ultraviolet rays and a reticle holding member; and a robot constructed and arranged to transfer the reticle from each one of the reticle exposure station, the reticle storage area and the reticle cleaning station.

* * * * *